United States Patent [19]

Gabara

[11] Patent Number: 5,675,263
[45] Date of Patent: Oct. 7, 1997

[54] HOT-CLOCK ADIABATIC GATE USING MULTIPLE CLOCK SIGNALS WITH DIFFERENT PHASES

[75] Inventor: Thaddeus J. Gabara, Murray Hill, N.J.

[73] Assignee: Lucent Technologies Inc., Murray Hill, N.J.

[21] Appl. No.: 561,547

[22] Filed: Nov. 21, 1995

Related U.S. Application Data

[63] Continuation of Ser. No. 276,139, Jul. 18, 1994, abandoned.

[51] Int. Cl.$^6$ .................................................. H03K 19/096
[52] U.S. Cl. .................................. 326/97; 326/98; 326/21; 326/121
[58] Field of Search .................................. 326/95, 97, 98, 326/34, 21, 121

[56] References Cited

U.S. PATENT DOCUMENTS

| | | | |
|---|---|---|---|
| 3,716,724 | 2/1973 | Parrish et al. | 307/221 C |
| 3,808,462 | 4/1974 | Parrish et al. | 307/225 |
| 4,164,666 | 8/1979 | Hirasawa | 307/208 |
| 4,568,842 | 2/1986 | Kolke | 307/279 |
| 4,719,597 | 1/1988 | Kumanoya et al. | 365/189 |
| 4,996,454 | 2/1991 | Peczalski et al. | 307/480 |
| 5,003,204 | 3/1991 | Cushing et al. | 307/465 |

OTHER PUBLICATIONS

Seitz et al, "Hot–Clock nMOS 1985 Chapel Hill Conference on VLSI", pp. 1–17.
Koller et al., "Adiabatic Switching, Low Energy Computing, and The Physics of Storing and Erasing Information", Aug. 5, 1992, pp. 1–5.

*Primary Examiner*—Edward P. Westin
*Assistant Examiner*—Stephen Calogero

[57] ABSTRACT

A hot clock adiabatic gate, using CMOS technology, incorporates an ancillary transistor. The gate is energized by multiple clock signals of different phases to reduce power consumption. The output logic voltage of the gate can reach full-rail voltage by allowing the CMOS technology to discharge via the ancillary transistor. The hot clock adiabatic gate and associated ancillary transistor may be incorporated into various logic circuits, such as an inverter, a memory cell, a NAND gate, and a NOR gate. In one configuration, a CMOS inverter is controlled by four clock signals having four discrete phases. The CMOS inverter optimally includes a CMOS gate transistor pair wherein the semiconductor channels of two ancillary transistors are in series with the semiconductor channels of the CMOS gate transistor pair.

15 Claims, 7 Drawing Sheets

5,675,263

HOT-CLOCK ADIABATIC GATE USING MULTIPLE CLOCK SIGNALS WITH DIFFERENT PHASES

This application is a continuation application under 37 CFR 1.62 of prior application Ser. No. 08/276,139 filed on Jul. 18, 1994, now abandoned.

BACKGROUND OF THE INVENTION

1. Field of the Invention

The present invention pertains to low-power semiconductor circuitry. More particularly, the present invention pertains to complementary transistor gates for adiabatic circuits.

2. Discussion of Related Art

Circuits that operate with low power requirements are desirable for use in many electronic devices, particularly portable devices that are powered by batteries, solar cells, or other limited-capacity power supplies. One of the advantages of CMOS circuitry has been its low rate of power dissipation relative to emitter-coupled logic (ECL), bipolar, and other types of semiconductor circuit devices.

However, even as mask technology reduces the size of CMOS structral elements to the submicron range, these elements are increasingly called upon to perform their switching functions at the high end of the frequency spectrum. As a result, some recent CMOS circuit designs have wattages more appropriate for the common lightbulb than for submicron, heat-sensitive VLSI semiconductor packages.

Generally, the energy dissipated in switching can be reduced to provide adiabatic performance if logic switching is performed quasi-statically: the dissipation of energy through a dissipative medium is reduced if the transfer is made gradually enough. Despite their name, so-called "hot clock" circuits are unconventional circuit designs that apply this principle to provide adiabatic performance. These devices reduce the rate of change in the circuit, but "gradually" is a relative concept. Known "hot clock" circuits are capable of operating at frequencies as high as 20 MHz in 0.9 micron CMOS. Under these conditions a 5x to 10x power dissipation reduction can be achieved by hot-clock designs.

Hot-clock logic designs supply all power to the gates via their clock lines, as described by Seitz, et al. at the Chapel Hill VLSI Conference in 1985. Quasi-static logic operations have two cardinal rules, rules familiar to those in the DC to DC converter art: (1) Never enable a switch unless the potential across it is zero; (2) Never disable a switch if there is a current flowing through it.

Hot-clock circuit performance in CMOS has been improved by adding blocking diodes, as disclosed by Avery, et al., in Ser. No. 08/175,709 filed Dec. 30, 1993. However, the resulting circuit may require that clock levels be boosted asymmetrically, or that level shifters be provided between gates or low-threshhold diodes be used to overcome the resulting diminished signal voltage swings at the circuit's output.

SUMMARY OF THE INVENTION

A CMOS gate in accordance with the present invention includes a gate transistor pair, an output node between the gate transistors in the pair, and a pair of gate clock signals. Each gate clock signal is connected to the source electrode of a respective CMOS gate transistor.

An ancillary transistor preferably has its channel adapted for connection to the drain of each gate transistor and the output node. A respective one of a pair of complementary ancillary clock signals is connected to the gate electrode, the "control element" of each respective ancillary transistor. Said ancillary clock signals are phase-shifted from the gate clock signals so that said four clock signals have four distinct phases, whereby the gate transistor pair is enabled to establish and maintain full-rail voltage values at the output node. Preferably, these four clock signals are phase-shifted a full 90 degrees from each other.

In particular, the ancillary transistors and offset clock signals of the present invention provide adiabatic performance while producing full-rail voltage swings at gate outputs. In a preferred embodiment this is achieved in homogeneous CMOS device packages. Homogenous packages are simpler to fabricate than the composite packages required for circuits that include functions such as output level shifting or an asymmetric boost on the clock leads. In particular, the Schottky diodes that are preferable for use as blocking diodes are non-MOS devices and their use can be avoided, for many applications, in accordance with the present invention.

In another embodiment the interaction of blocking diodes with offset clock signals in accordance with the present invention provides a further reduction of non-adiabatic device charging in a circuit, for specially demanding applications.

BRIEF DESCRIPTION OF THE DRAWINGS

The features and advantages of the present invention will be better understood when the detailed description of a preferred embodiment given below is considered in conjunction with the drawings provided, wherein.

DETAILED DESCRIPTION OF THE PREFERRED EMBODIMENTS

Figure 1:
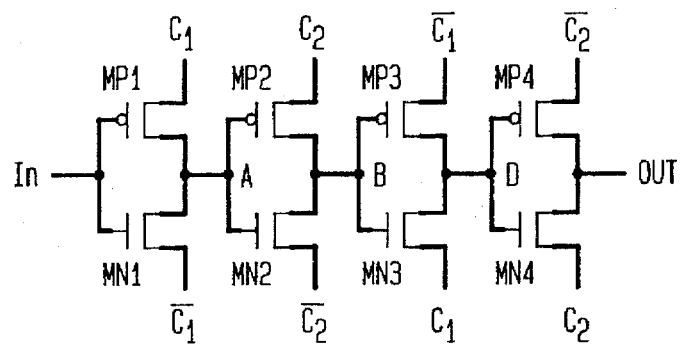
FIG. 1 is a diagram of a prior art logic circuit.
Figure 2:
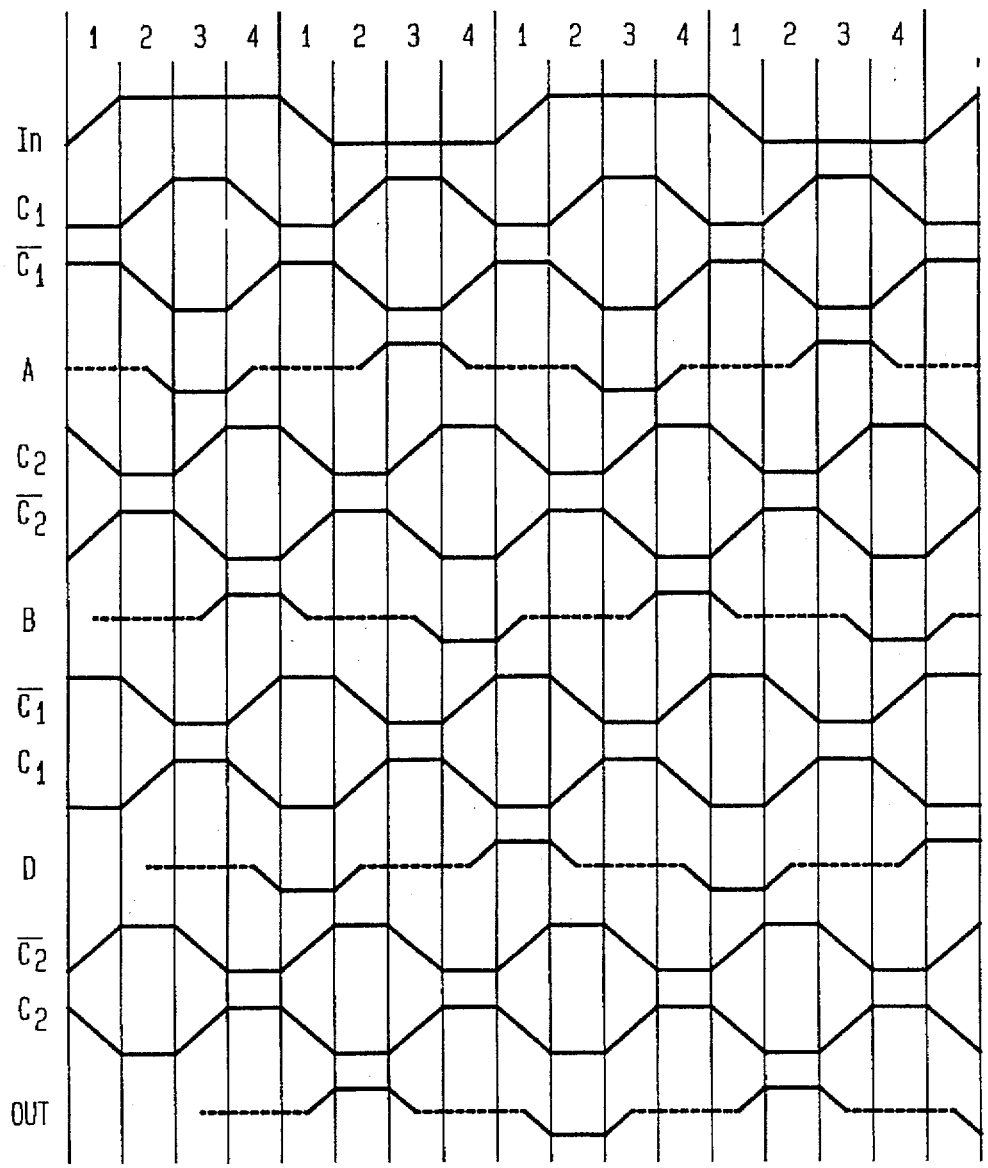
FIG. 2 is a timing diagram for the circuit of FIG. 1.

FIG. 1 shows a string of CMOS inverters using two offset trapezoidal "hot clock" signals $C_1$ and $C_2$, and their complements, to obtain adiabatic operation. In FIG. 2, it can be seen that output waveforms A, B and D do not swing "full rail" through the full voltage range $V_{SS}$–$V_{DD}$ in response to full-rail swings in the input signal In.

In the FIG. 1 circuit, the input signal that is supplied to the control element of each gate transistor changes during a SETUP PHASE (#1) when the clock signal input to that gate has been entirely disabled, as required for adiabatic operation, and the gate's output floats, as indicated by the dashed line. However, the gate's output is, by then, already floating in midrange rather than holding the full logic values $V_{SS}$ and $V_{DD}$.

For example, in FIG. 2, when $C_1$ goes high during the ENABLE PHASE (#2), MN1 becomes enabled and output A makes the transition to full $V_{SS}$ and holds that value. However, because the clock signal is trapezoidal, during the DISABLE PHASE (#4) gate transistors MP1 and MN1 being disabled, and the active gate transistor MN1 remains active long enough to permit a current to pass through MN1, causing the output A to follow the clock $\overline{C}_1$ to a mid-range voltage. Then, MN1 finally becomes disabled, and the output A floats at midrange during the rest of the DISABLE PHASE (#4) rather than hold its full-rail value of $V_{SS}$. The output A continues to float during the subsequent SETUP PHASE (#1), when the gate transistors have completed their transitions and the path between $C_1$ and its complement $\overline{C}_1$ is once again cut off.

The input signal In in this timing diagram changes value from $V_{DD}$ to $V_{SS}$, or $V_{SS}$ to $V_{DD}$ during the SETUP PHASE (#1). In the ENABLE PHASE (#2), that full-rail change in the input signal In during the SETUP PHASE (#1) produces a belated, partial change in the output signal A from midrange to a full $V_{DD}$ or $V_{SS}$ value in the ENABLE PHASE (#2). This distorted signal appearing at the output of the gate A then propagates through the rest of the inverter gates B, D and Out, in this orderly but unsatisfactory fashion.

Figure 3:
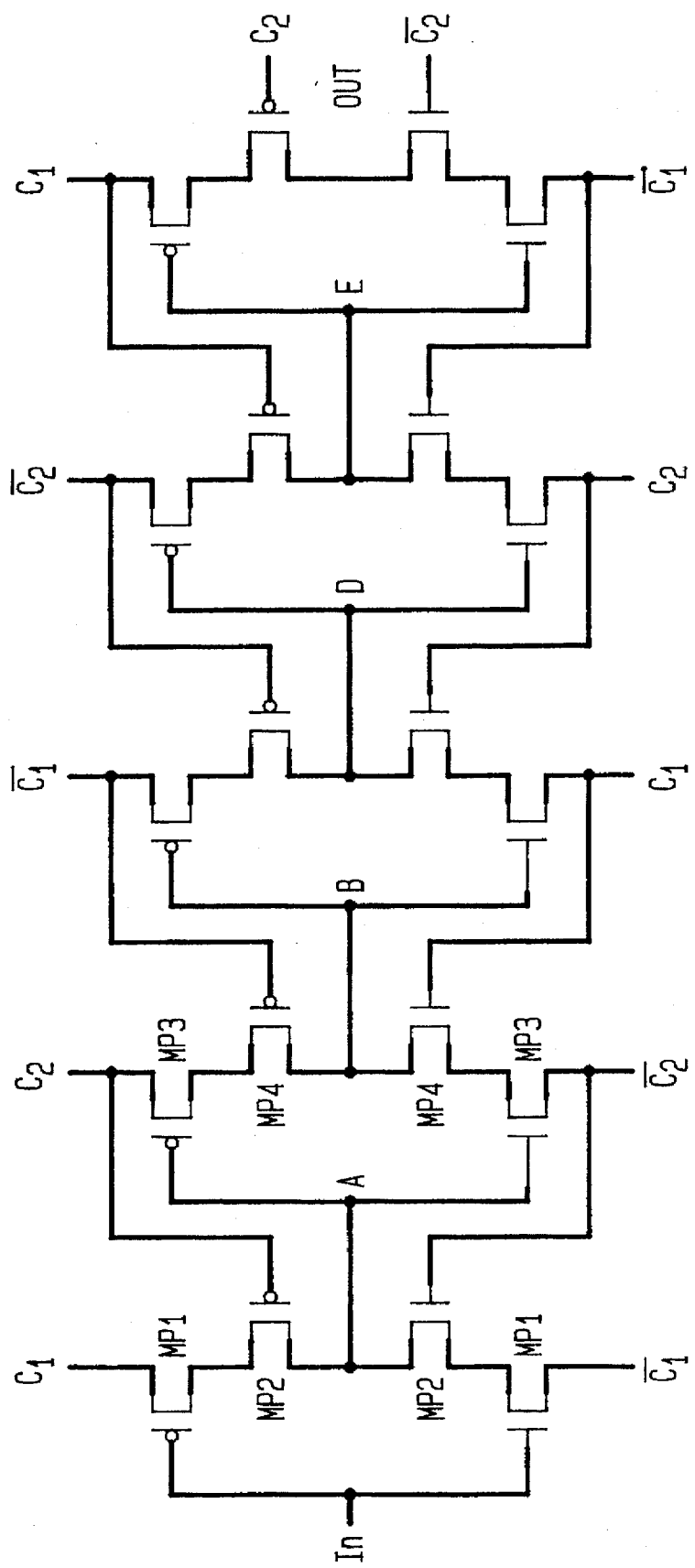
FIG. 3 is a diagram of a CMOS logic circuit in accordance with a first embodiment of the present invention.

FIG. 3 shows another serial string of inverters that provides full-rail signal transitions and improved adiabatic performance in accordance with a first embodiment of the present invention. Again, each pair of gate clock signals, such as $C_1$ and $\overline{C}_1$, is connected to the source electrodes of a respective pair of CMOS gate transistors MP1 and MN1, and the drain electrode of each gate transistor MP1 and MN1 is connected to the gate's output node through ancillary transistors MP2 and MN2.

However, in FIG. 3, an ancillary transistor MP2 or MN2 is connected between each respective gate clock and the output node. Specifically, the source electrode of each ancillary transistor, MP2 and MN2 is connected to the drain electrode of the respective gate transistor MP1 or MN1 and the drain electrode is connected to the output node A. Also, a respective one of a pair of complementary clock signals $\overline{C}_2$ and $C_2$ that are offset from the gate clock signals of that gate, $C_1$ and $\overline{C}_1$, is connected to the gate electrode, the "control element" of each respective ancillary transistor MP2 or MN2.

Figure 4:
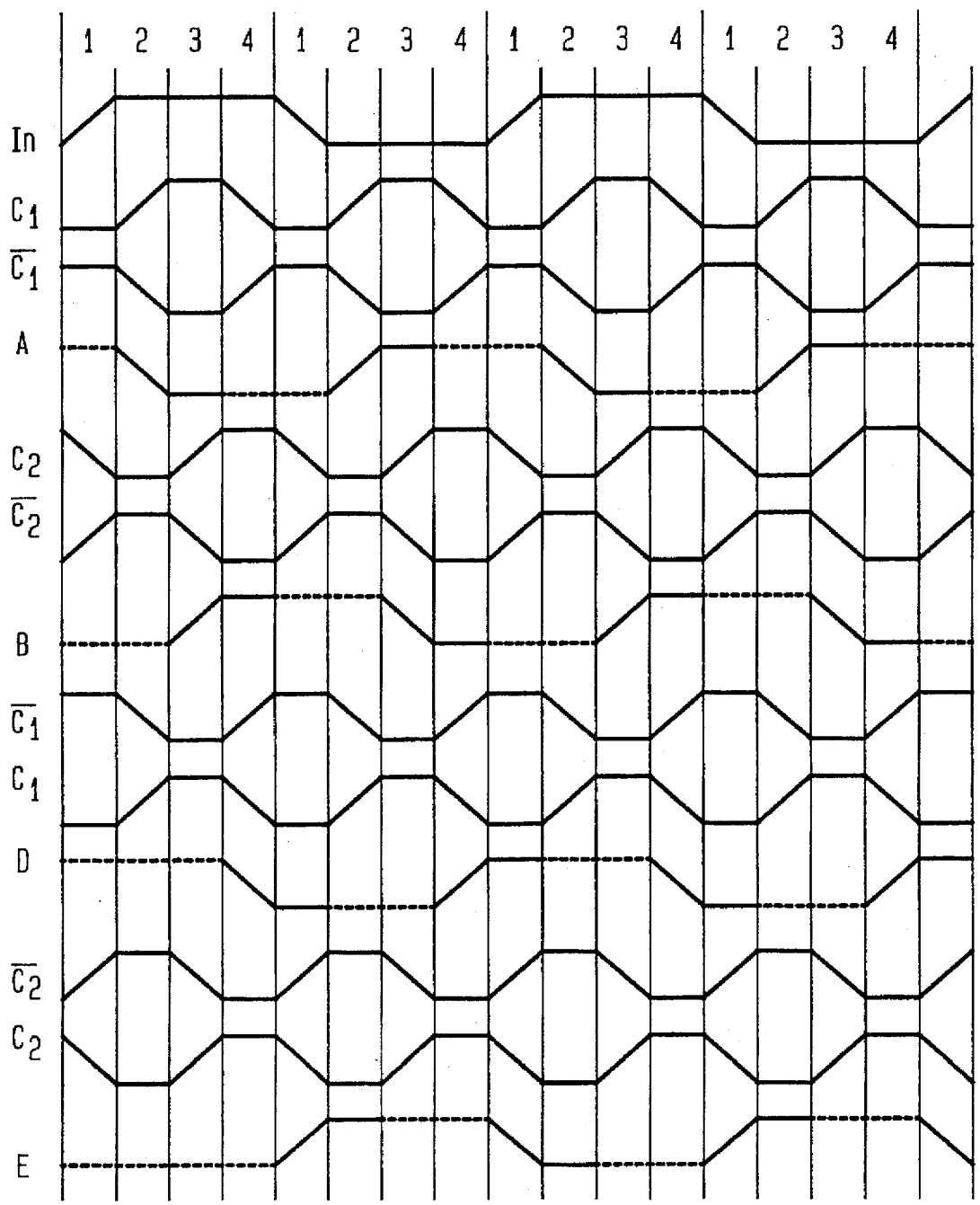
FIG. 4 is a timing diagram for the circuit of FIG. 3.

In FIG. 3 the gate clock pair in each stage, for example $C_1$ or $C_2$ and its complement, is also supplied to a previous stage, a stage that is driven by another, offset clock, $C_2$ or $C_1$ respectively. This assures that the ancillary transistors MP2 or MN2 will be cut off during the gate's DISABLE PHASE (#4), so that the path between the clock signals and the output A is disrupted. In contrast to FIG. 1, each ancillary transistor MP2, MN2 is fully cut off while the gate transistor MP1, MN1 connected in series with it is in transition in FIG. 4, and the output A remains at its full-rail value. This action of the gate's ancillary transistors produces a full-rail voltage swing at output A during the subsequent ENABLE PHASE (#2), as in FIG. 4.

Figure 5B:
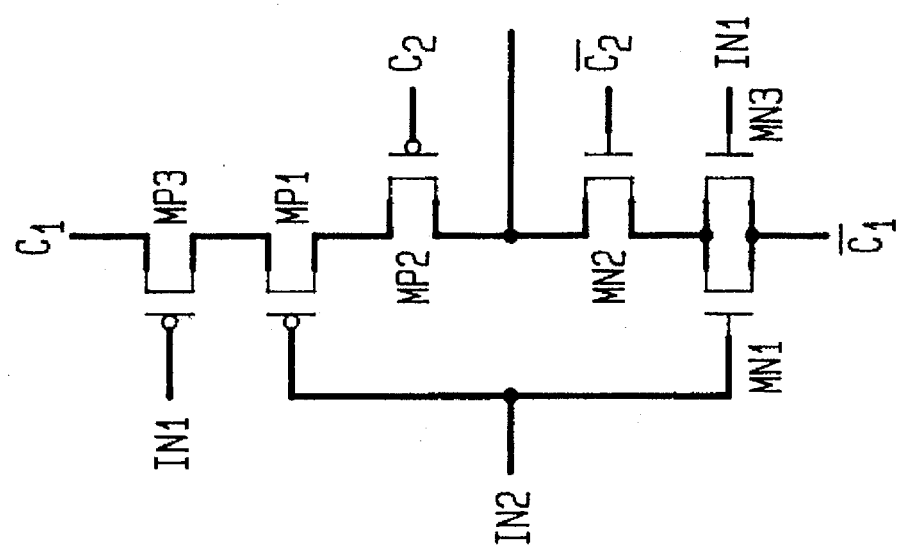
FIGS. 5a through 5c are diagrams of other types of logic gates in accordance with the present invention.
Figure 5A:
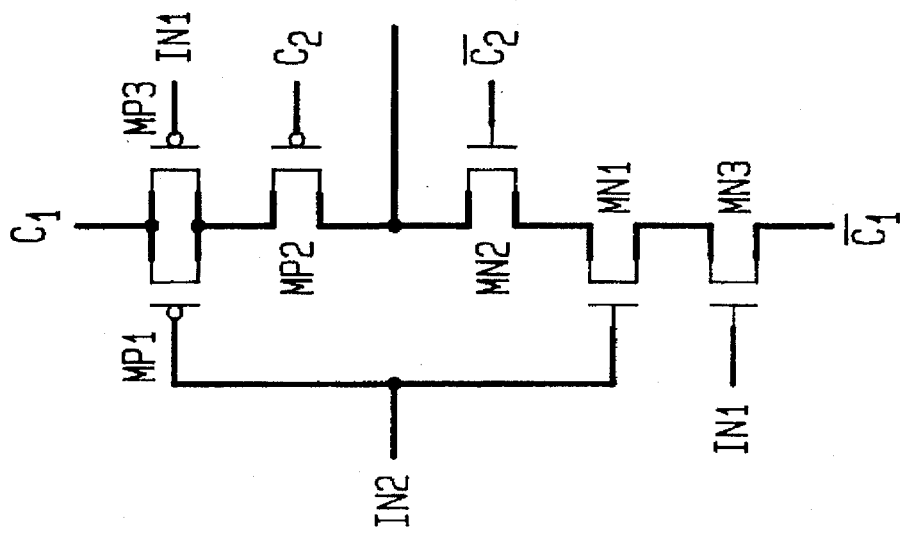

FIG. 5a shows a CMOS NAND gate circuit in accordance with the present invention. FIG. 5b shows a CMOS NOR gate circuit in accordance with the present invention. In these logic gates the gate transistors are controlled by the input signals IN1 and IN2. Offset clock $C_2$, and its complement, control the auxiliary transistors MN3 and MP3, respectively. These ancillary transistor pairs prevent the outputs A from following the trapezoidal clocks by disrupting the path to the gates' outputs during the transitions of clock $C_1$ and its inverse, as in FIGS. 3 and 4.

Figure 5C:
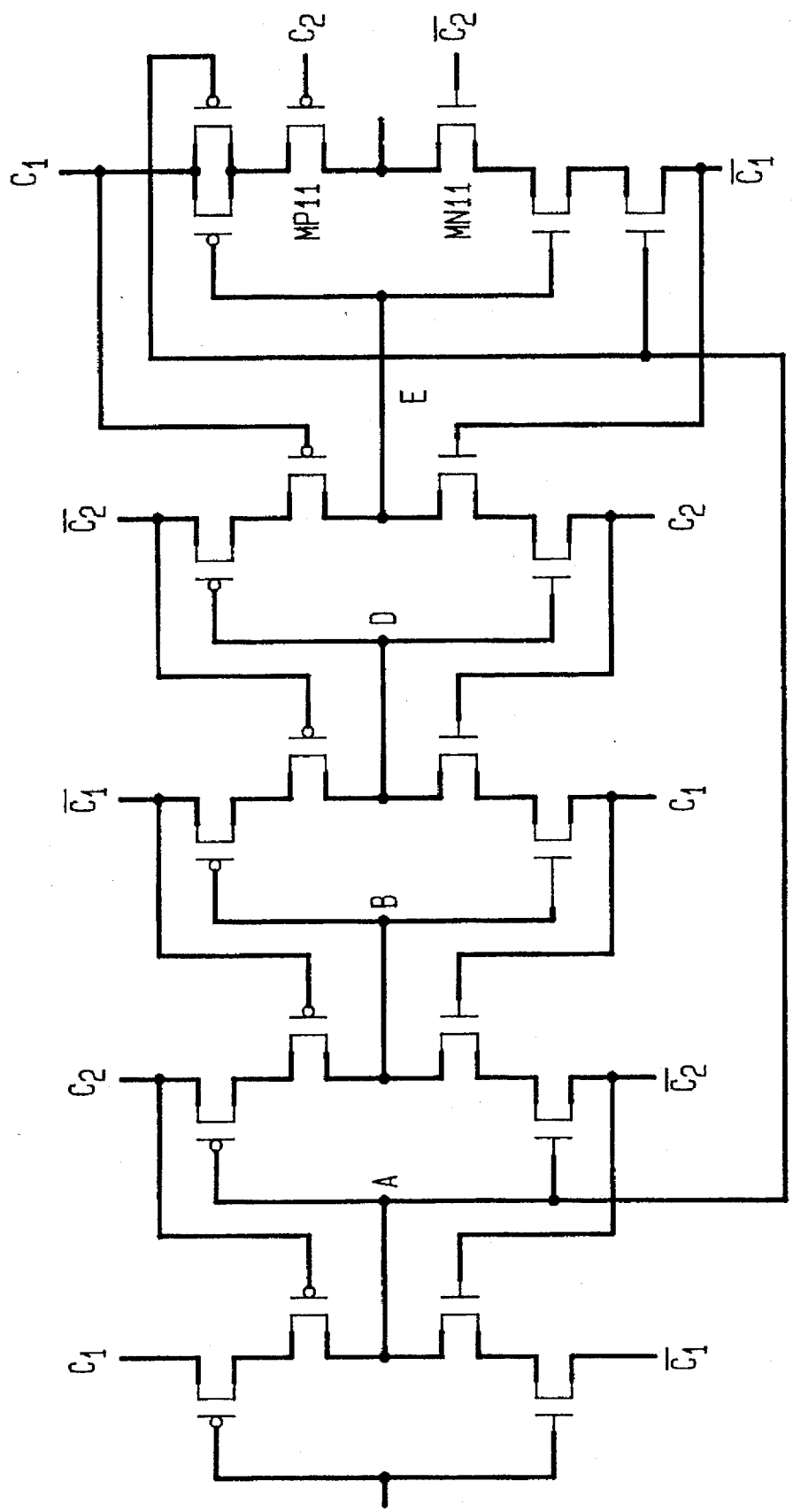
Figure 5D:
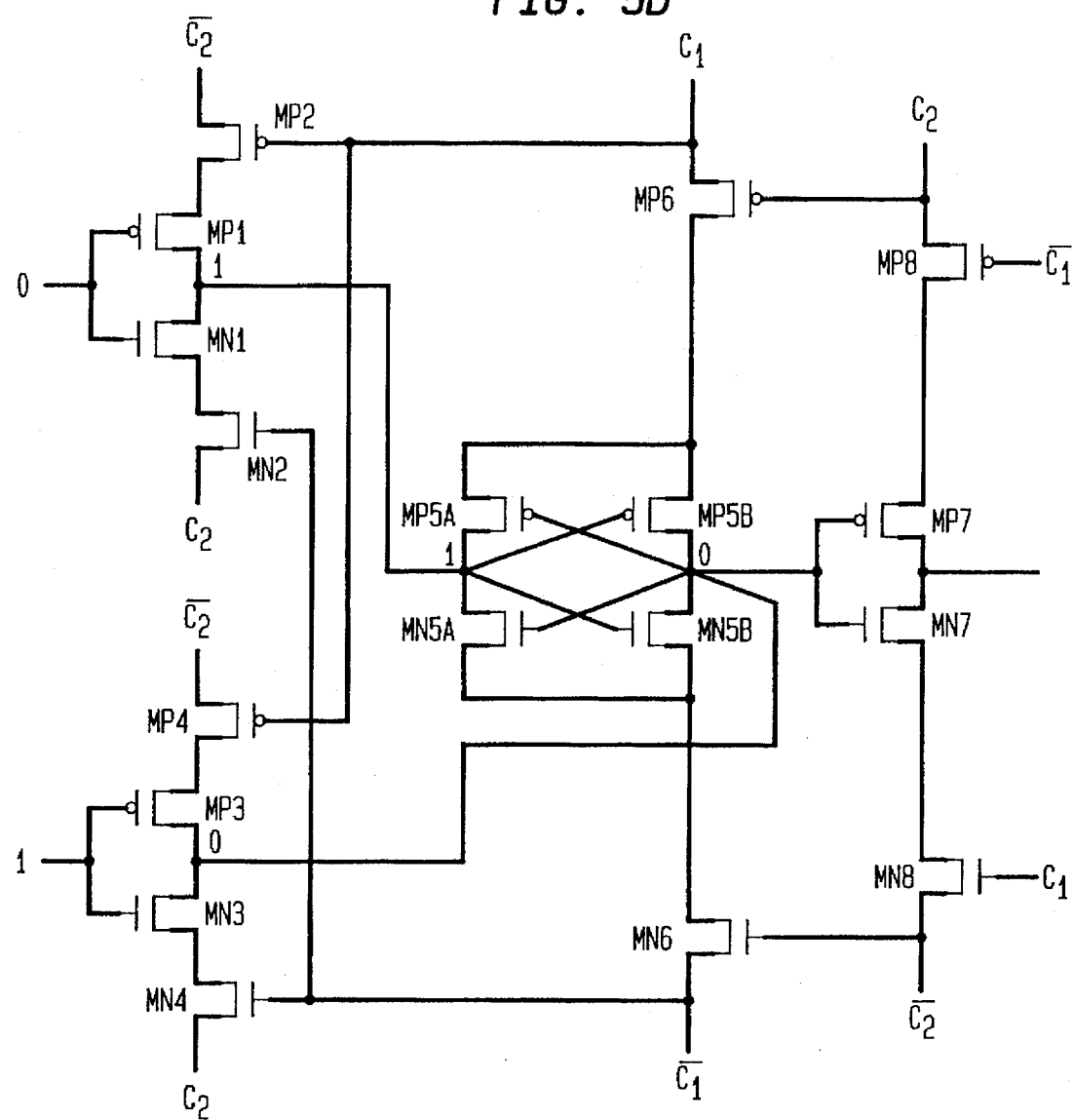
FIG. 5d is a schematic diagram of a memory cell that incorporates ancillary transistors controlled by multiple clock signals of different phases, according to the principles of the present invention.
Figure 5E:
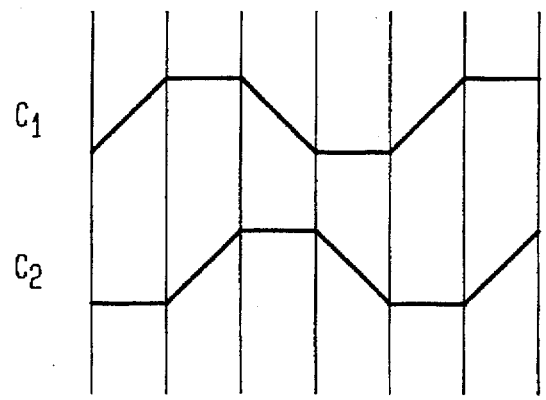
FIG. 5e is a graph illustrating the amplitude and relative phase of multiple clock signals, which are preferably applied to the memory cell circuit illustrated in FIG. 5d.
Figure 6:
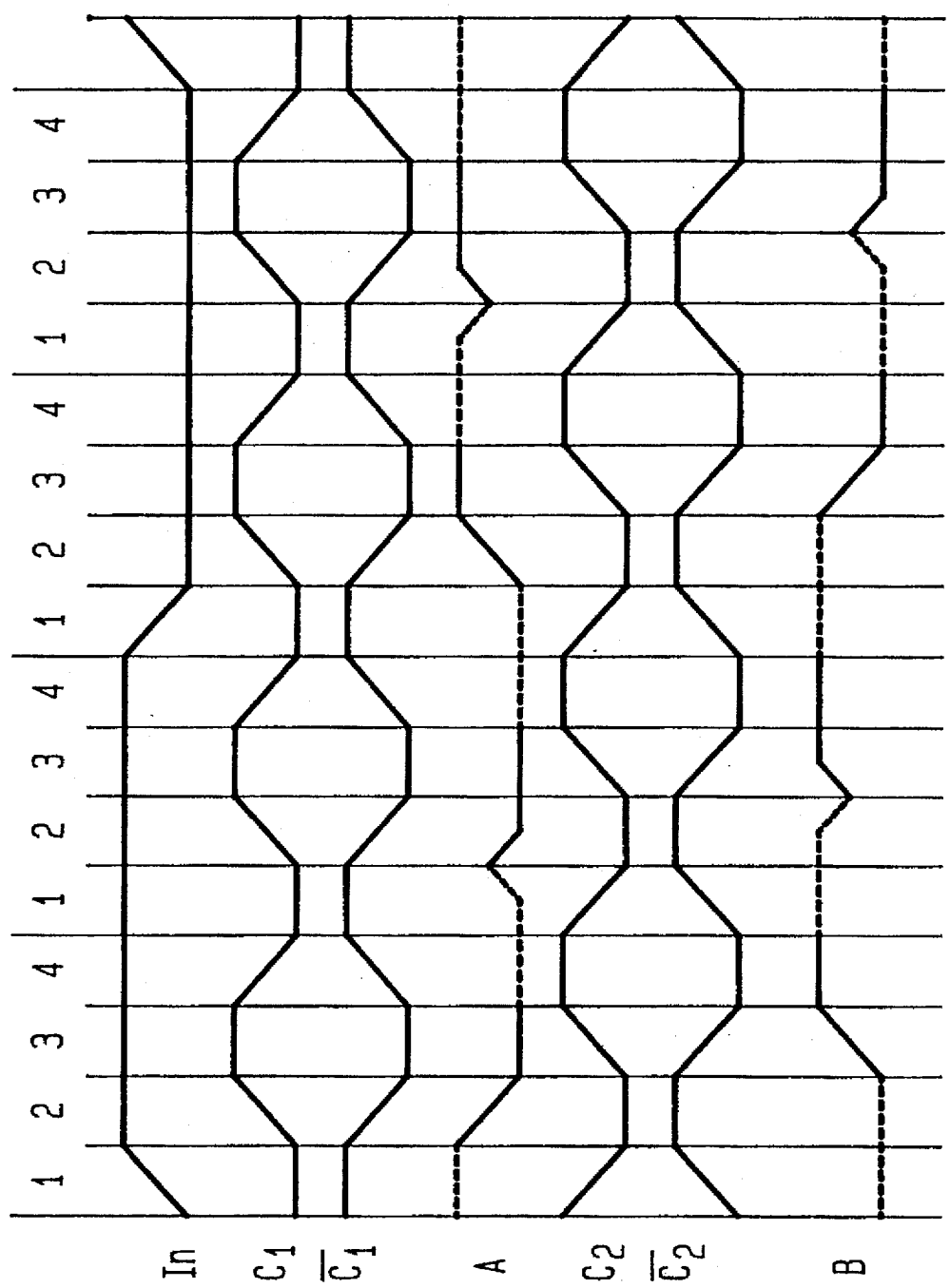
FIG. 6 is a timing diagram for the circuit of FIG. 3, showing a different input signal In; and Like reference numerals indicate like structures.

Of course, inverters and other gates in accordance with the present invention can be connected in series as shown in FIG. 3, or in parallel as shown in FIG. 5c, or in any combination thereof. Also, rather than being a logic gate, the gate may be a memory cell, as shown in FIG. 5d. In each instance, the ancillary transistors between the respective gate clocks and the gate output prevent the trapezoidal clocks from wasting power and distorting the output signal, as explained above.

It will be appreciated by one skilled in the art that variations and modifications of the disclosed apparatus are possible within the spirit and scope of this invention. For example, the clocks C1, C2 need not be fully 90 degrees offset to enjoy some of the benefits of the present invention. The embodiments described are provided to illustrate presently preferred ways of making and using this invention. The invention is defined by the claims appended below.

I claim:

1. A circuit for performing digital logic operations, said circuit capable of being energized by clock signals, said circuit comprising:

a first gate transistor having a first gate and a first semiconductor channel, the first semiconductor channel switched by said first gate, a first clock signal being applied to the first semiconductor channel;

a second gate transistor, having a second gate and a second semiconductor channel, the second semiconductor channel switched by said second gate, a second clock signal being applied to the second semiconductor channel;

an output responsive to an input signal applied to the first gate and the second gate;

an ancillary transistor pair, each ancillary transistor in the ancillary transistor pair having an ancillary channel and an ancillary gate, the ancillary channel coupled with the first semiconductor channel and the second semiconductor channel, each ancillary gate in said ancillary transistor pair being connected to one of a respective complementary pair of clock signals selected from the group consisting of a third clock signal and a fourth clock signal which have complementary phase relationships relative to said first and second clock signals respectively such that said circuit can attain full rail voltage at the output.

2. The circuit of claim 1 wherein said said ancillary transistor pair has its ancillary channels in series with the first semiconductor channel of the first gate transistor and in series with the second semiconductor channel of the second gate transistor.

3. A circuit for performing digital logic operations, said circuit capable of being energized by clock signals, said circuit comprising:

a first gate transistor having a first gate and a first semiconductor channel, the first semiconductor channel switched by said first gate, a first clock signal being applied to the first semiconductor channel;

a second gate transistor, having a second gate and a second semiconductor channel, the second semiconductor channel switched by said second gate, a second clock signal being applied to the second semiconductor channel;

an output responsive to an input signal applied to the first gate and the second gate;

an ancillary transistor pair, each ancillary transistor in the ancillary transistor pair having an ancillary channel and an ancillary gate, the ancillary channel coupled with the first semiconductor channel and the second semiconductor channel, each ancillary gate in said ancillary transistor pair being connected to one of a respective complementary pair of clock signals selected from the group consisting of a third clock signal and a fourth clock signal such that said circuit can attain full rail voltage at the output;

a third gate transistor having a third semiconductor channel and a third gate;

a fourth gate transistor having a fourth semiconductor channel and a fourth gate;

an input formed by the third gate and the fourth gate;

wherein the first semiconductor channel of the first gate transistor is in parallel with the third semiconductor channel and the second semiconductor channel is in series with a fourth semiconductor channel such that said circuit comprises a NAND gate.

4. A circuit for performing digital logic operations, said circuit capable of being energized by clock signals, said circuit comprising:

a first gate transistor having a first gate and a first semiconductor channel, the first semiconductor channel switched by said first gate, a first clock signal being applied to the first semiconductor channel;

a second gate transistor, having a second gate and a second semiconductor channel, the second semiconductor channel switched by said second gate, a second clock signal being applied to the second semiconductor channel;

an output responsive to an input signal applied to the first gate and the second gate;

an ancillary transistor pair, each ancillary transistor in the ancillary transistor pair having an ancillary channel and an ancillary gate, the ancillary channel coupled with the first semiconductor channel and the second semiconductor channel, each ancillary gate in said ancillary transistor pair being connected to one of a respective complementary pair of clock signals selected from the group consisting of a third clock signal and a fourth clock signal such that said circuit can attain full rail voltage at the output;

a third gate transistor having a third semiconductor channel and a third gate;

a fourth gate transistor having a fourth semiconductor channel and a fourth gate;

an input formed by the third gate and the fourth gate;

wherein the first semiconductor channel of the first gate transistor is in series with the third semiconductor channel and wherein the second semiconductor channel is in parallel with a fourth semiconductor channel such that said circuit comprises a NOR gate.

5. A logic gate comprising:

a first switch having a first switch path, a first switching input and a first switching output, the first switching input controllably switched to the first switching output via the first switch path, the first switching input equipped to receive a first clock signal;

a second switch having a second switch path, a second switching input and a second switching output, the second switching input controllably switched to the second switching output via the second switch path, the second switching input equipped to receive a second clock signal;

an output node coupled to the first switching output and the second switching output;

a first ancillary transistor, the first ancillary transistor having a first ancillary gate and a first ancillary channel, the first ancillary channel responsive to a third clock signal when the third clock signal is applied to said first ancillary gate, the first ancillary channel being in series with the first switch path of the first switch; and a second ancillary transistor, the second ancillary transistor having a second ancillary gate and a second ancillary channel, the second ancillary channel responsive to a fourth clock signal when the fourth clock signal is applied to said second ancillary gate, the second ancillary channel being in series with the second switch path of the second switch;

such that the logic gate can establish full rail voltage values at the output node.

6. The gate according to claim 5 further comprising a clock, the clock providing the first clock signal, the second clock signal, and the third clock signal; and wherein the first clock signal, the second clock signal, and the third clock signal each have predetermined phase offsets with respect to one another.

7. The gate according to claim 5 further comprising a second ancillary transistor, the second ancillary transistor having a second ancillary gate and a second ancillary channel, the second ancillary channel responsive to a fourth clock signal when the fourth clock signal is applied to said ancillary gate, said fourth clock signal having a complementary phase relationship relative to said second clock signal, the second ancillary channel being in series with the second switch path of the second switch.

8. The logic gate according to claim 7 further comprising:

a third switch having a third switch control, a third switch path, a third switching input, and a third switching output, the third switch path being responsive to a logic input signal applied to the third switch control from the output node, the third switching input controllably switched to the third switching output via the third switch path, the third switching input equipped to receive the third clock signal;

a fourth switch having a fourth switch control, a fourth switch path, a fourth switching input, and a fourth switching output, the fourth switch path being responsive to a logic input signal applied to the fourth switch control from the output node, the fourth switching input controllably switched to the fourth switching output via the fourth switch path, the fourth switching input equipped to receive a fourth clock signal;

a third ancillary transistor, the third ancillary transistor having a third ancillary gate and a third ancillary channel, the third ancillary channel responsive to said second clock signal applied to said third ancillary gate, the third ancillary channel being in series with the third switch path of the third switch;

a fourth ancillary transistor, the fourth ancillary transistor having a fourth ancillary gate and a fourth ancillary channel, the fourth ancillary channel responsive to said first clock signal applied to said fourth ancillary gate, the fourth ancillary channel being in series with the fourth switch path of the fourth switch; and an additional output node connected to an electrical path between the fourth ancillary channel and the third ancillary channel.

9. The gate according to claim 7 further comprising a clock, the clock providing the first clock signal, the second clock signal, the third clock signal, and the fourth clock signal; and wherein the first clock signal, the second clock signal, the third clock signal, and the fourth clock signal each have different phases, which are a first phase, a second phase, a third phase, and a fourth phase.

10. The gate according to claim 9 wherein the first phase is substantially opposite with respect to the second phase, and wherein the third phase is substantially opposite with respect to the fourth phase.

11. The logic gate according to claim 7 further comprising:
   a first complementary metal-oxide-semiconductor inverter, having a first inverter output;
   a third ancillary transistor having a third ancillary channel and a third ancillary gate, the third ancillary gate connected with the first ancillary gate of the first ancillary transistor, the third ancillary channel coupled with the first inverter output; and
   a fourth ancillary transistor having a fourth ancillary channel and a fourth ancillary gate, the fourth ancillary gate connected with the second ancillary gate; the fourth ancillary channel coupled with the first inverter output.

12. The logic gate according to claim 11, further comprising:
   a second complementary metal oxide semiconductor inverter having a second inverter input, the second inverter input coupled to the output node;
   a fifth ancillary transistor having a fifth ancillary channel connected to an output of the second complement my metal oxide inverter and a fifth ancillary gate connected to the third ancillary gate of the third ancillary transistor; and
   a sixth ancillary transistor having a sixth ancillary channel connected to the output of the second complementary metal oxide inverter and a sixth ancillary gate connected to the fourth ancillary gate of the fourth ancillary transistor so that the logic gate comprises a memory cell.

13. The gage according to claim 5 wherein the first switch and the second switch comprise complementary metal oxide semiconductors.

14. The logic gate according to claim 5, wherein the logic gate is a logic device selected from the group consisting of an inverter, a NOR gate, and a NAND gate.

15. A logic gate comprising:
   a first switch having a first switch path, a first switching input, and a first switching output, the first switching input controllably switched to the first switching output via the first switch bath, the first switching input equipped to receive a first clock signal;
   a second switch having a second switch path, a second switching input and a second switching output, the second switching input controllably switched to the second switching output via the second switch path, the second switching input equipped to receive a second clock signal;
   an output node coupled to the first switching output and the second switching output;
   a first ancillary transistor, the first ancillary transistor having a first ancillary gate and a first ancillary channel, the first ancillary channel responsive to a third clock signal when the third clock signal is applied to said first ancillary gate, the first ancillary channel being in series with the first switch path of the first switch such that the logic gate can establish full rail voltage values at the output node;
   a second ancillary transistor, the second ancillary transistor having a second ancillary gate and a second ancillary channel, the second ancillary channel responsive to a fourth clock signal when the fourth clock signal is applied to said second ancillary gate, the second ancillary channel being in series with the second switch path of the second switch;
   a clock, the clock providing a first clock signal, a second clock signal, a third clock signal, and a fourth clock signal; and wherein the first clock signal, the second clock signal, the third clock signal, and the fourth clock signal each have different phases which are, a first phase, a second phase, a third phase, and a fourth phase, the first phase and the third phase having a predetermined relative offset of approximately ninety degrees, and the second phase and the fourth phase having a predetermined relative offset also of approximately ninety degrees.

\* \* \* \* \*